United States Patent
Choi et al.

(10) Patent No.: US 8,594,469 B2
(45) Date of Patent: Nov. 26, 2013

(54) OPTICAL AMPLIFIER

(75) Inventors: Byung-Seok Choi, Daejeon (KR); Dae Kon Oh, Daejeon (KR); O-Kyun Kwon, Daejeon (KR); Dong Churl Kim, Daejeon (KR); Kisoo Kim, Daejeon (KR); Hyun Soo Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 307 days.

(21) Appl. No.: 12/640,627

(22) Filed: Dec. 17, 2009

(65) Prior Publication Data

US 2010/0158427 A1 Jun. 24, 2010

(30) Foreign Application Priority Data

Dec. 22, 2008 (KR) .................. 10-2008-0130966
Aug. 28, 2009 (KR) .................. 10-2009-0080500

(51) Int. Cl.
*G02F 1/035* (2006.01)

(52) U.S. Cl.
USPC .............................. 385/2; 359/344

(58) Field of Classification Search
USPC .................. 385/2; 359/44
See application file for complete search history.

(56) References Cited

U.S. PATENT DOCUMENTS

| 4,735,677 | A | * | 4/1988 | Kawachi et al. | 438/25 |
|---|---|---|---|---|---|
| 4,772,854 | A | * | 9/1988 | Silberberg | 359/344 |
| 4,856,014 | A | * | 8/1989 | Figueroa et al. | 372/46.01 |
| 5,223,972 | A | * | 6/1993 | Nishimura et al. | 359/337 |
| 5,946,336 | A | * | 8/1999 | Mizutani et al. | 372/50.1 |
| 6,078,417 | A | * | 6/2000 | Perino et al. | 398/157 |
| 6,134,259 | A | * | 10/2000 | Danziger et al. | 372/99 |
| 6,249,373 | B1 | * | 6/2001 | Woodward | 359/344 |
| 6,341,189 | B1 | * | 1/2002 | Deacon | 385/130 |
| 6,625,192 | B2 | * | 9/2003 | Arbel et al. | 372/69 |
| 6,859,477 | B2 | * | 2/2005 | Deppe et al. | 372/45.01 |
| 6,888,863 | B1 | * | 5/2005 | Chen et al. | 372/43.01 |

(Continued)

FOREIGN PATENT DOCUMENTS

| JP | 2004-119768 | 4/2004 |
|---|---|---|
| JP | 2004-119768 A | 4/2004 |

(Continued)

OTHER PUBLICATIONS

Antonio Mecozzi. "Small-Signal Theory of Wavelength Converters Based on Cross-Grain Modulation in Semiconductor Optical Amplifiers" *IEEE Photonics Technology Letters*, vol. 8, No. 11, Nov. 1996, pp. 1471-1473.

(Continued)

*Primary Examiner* — Charlie Peng
*Assistant Examiner* — Peter Radkowski
(74) *Attorney, Agent, or Firm* — Rabin & Berdo, P.C.

(57) ABSTRACT

An optical amplifier includes a passive waveguide region and an active waveguide region. The passive waveguide region is configured to receive an incident optical signal and adjust a mode of the optical signal. The active waveguide region is integrated to the passive waveguide region and configured to perform gain modulation on the optical signal received from the passive waveguide region by changing density of carriers in response to a current applied to the active waveguide region. Internal loss of the active waveguide region is adjusted to produce a resonance effect and thereby to increase bandwidth of the active waveguide. Therefore, the optical amplifier can have a wide bandwidth under a low-current condition.

12 Claims, 10 Drawing Sheets

(56) References Cited

U.S. PATENT DOCUMENTS

| | | | |
|---|---|---|---|
| 7,045,374 B2 * | 5/2006 | Lee et al. | 438/31 |
| 7,046,435 B2 * | 5/2006 | Shin et al. | 359/344 |
| 7,064,891 B2 * | 6/2006 | Maeda et al. | 359/344 |
| 7,126,749 B2 * | 10/2006 | Heim et al. | 359/344 |
| 7,280,267 B2 * | 10/2007 | Van Tuyl | 359/318 |
| 2001/0008571 A1 * | 7/2001 | Chivers | 385/75 |
| 2001/0028769 A1 * | 10/2001 | Deacon | 385/50 |
| 2001/0043390 A1 * | 11/2001 | Kim et al. | 359/344 |
| 2001/0046250 A1 * | 11/2001 | Arbel et al. | 372/108 |
| 2002/0118918 A1 * | 8/2002 | Goldberg | 385/31 |
| 2003/0112841 A1 * | 6/2003 | Massa et al. | 372/43 |
| 2003/0174393 A1 * | 9/2003 | Maeda et al. | 359/344 |
| 2003/0180021 A1 * | 9/2003 | Ouellet | 385/129 |
| 2004/0120028 A1 * | 6/2004 | Heim et al. | 359/344 |
| 2004/0131097 A1 * | 7/2004 | Deppe et al. | 372/45 |
| 2005/0084991 A1 * | 4/2005 | Lee et al. | 438/21 |
| 2005/0185246 A1 * | 8/2005 | Van Tuyl | 359/241 |
| 2007/0133990 A1 * | 6/2007 | Kim et al. | 398/72 |
| 2007/0183788 A1 * | 8/2007 | Kim et al. | 398/160 |
| 2007/0189777 A1 * | 8/2007 | Arahira | 398/155 |
| 2008/0137180 A1 * | 6/2008 | Oh et al. | 359/344 |
| 2011/0026923 A1 * | 2/2011 | Kim et al. | 398/79 |

FOREIGN PATENT DOCUMENTS

| | | | |
|---|---|---|---|
| JP | 2006262020 A | * | 9/2006 |
| JP | 2006269926 A | * | 10/2006 |
| KR | 10-0520796 | | 10/2005 |
| KR | 10-0520796 A | | 10/2005 |
| KR | 10-0785775 | | 12/2007 |
| KR | 10-0785775 A | | 12/2007 |
| KR | 2008-0052237 A | | 6/2008 |

OTHER PUBLICATIONS

Jesper Mork et al. "The Modulation Response of a Semiconductor Laser Amplifier" *IEEE Journal of Selected Topics in Quantum Electronics*, vol. 5, No. 3, May/Jun. 1999, pp. 851-860.

Mads L. Nielsen et al., "A Transfer Function Approach to the Small-Signal Response of Saturated Semiconductor Optical Amplifiers" *Journal of Lightwave Technology*, vol. 18, No. 12, Dec. 2000, pp. 2151-2157.

* cited by examiner

OPTICAL AMPLIFIER

CROSS-REFERENCE TO RELATED APPLICATIONS

This U.S. non-provisional patent application claims priority under 35 U.S.C. §119 of Korean Patent Application Nos. 10-2008-0130966, filed on Dec. 22, 2008, and 10-2009-0080500, filed on Aug. 28, 2009, the entire contents of which are hereby incorporated by reference.

BACKGROUND OF THE INVENTION

The present invention disclosed herein relates to an optical amplifier.

Much research has been conducted on various network structures and network switches to transmit large amounts of data at high rates in our current high-speed internet and multimedia service environment. Currently, fiber to the home (FTTH) technology is being developed in many countries to realize high-speed transmission of large quantities of data through optical fiber connections between telephone companies and homes. For this end, many types of optical networks are being studied, and resultantly, much R&D is currently focused on various optical network devices.

Unlike other optical amplifiers, semiconductor optical amplifiers are fabricated based on semiconductor technology, enabling semiconductor optical amplifiers to be integrated with existing semiconductor optical devices, while being small-sized with non-linear characteristics. Therefore, not only can semiconductor optical amplifiers be used as optical amplifiers, but they can also be used as photonic switches, optical add/drop devices, wavelength converters, and the like.

SUMMARY OF THE INVENTION

The present invention provides a semiconductor optical amplifier which is operable with a less current and has improved bandwidth characteristics.

Embodiments of the present invention provide optical amplifiers including: a passive waveguide region configured to receive an incident optical signal and adjust a mode of the optical signal; and an active waveguide region integrated to the passive waveguide region and configured to perform gain modulation on the optical signal received from the passive waveguide region by changing density of carriers in response to a current applied to the active waveguide region, wherein internal loss of the active waveguide region is adjusted to produce a resonance effect and thereby to increase bandwidth of the active waveguide.

In some embodiments, the internal loss of the active waveguide region may be increased by increasing absorption coefficient thereof.

In other embodiments, the internal loss of the active waveguide region may be increased by doping the active waveguide region.

In still other embodiments, the internal loss of the active waveguide region may be increased by increasing scattering loss of the active waveguide region.

In even other embodiments, the scattering loss of the active waveguide region may be increased by adjusting a surface roughness or width of the active waveguide region.

In yet other embodiments, the optical amplifier may further include a laser diode disposed in the active waveguide region and configured to receive a current independently for radio frequency (RF) modulation or biasing.

In other embodiments of the present invention, optical amplifiers include: a passive waveguide region configured to receive an incident optical signal and adjust a mode of the optical signal; and an active waveguide region integrated to the passive waveguide region and configured to perform gain-modulation on the optical signal received from the passive waveguide region by changing density of carriers in response to a current applied to the active waveguide region, wherein the active waveguide region includes: an amplification region configured to amplify the optical signal in response to a first bias current applied to the amplification region after the optical signal passes through passive waveguide region; and a modulation region configured to modulate the optical signal in response to a second bias current and an RF signal applied to the modulation region after the optical signal passes through the amplification region, wherein the bandwidth of the device is more increased owing to a bigger resonance effect caused by internal loss of the active waveguide region and combined interaction with additional parts.

In some embodiments, the internal loss of the active waveguide region may be increased by increasing absorption coefficient thereof.

In other embodiments, the internal loss of the active waveguide region may be increased by doping the active waveguide region.

In still other embodiments, the internal loss of the active waveguide region may be increased by increasing scattering loss of the active waveguide region.

In even other embodiments, the scattering loss of the active waveguide region may be increased by adjusting a surface roughness or width of the active waveguide region.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Embodiments of the present invention may provide an optical amplifier in which a resonance effect can be caused by adjusting internal loss during an optical signal gain modulation operation. The internal loss adjustment may include scattering loss adjustment or absorption coefficient adjustment. In addition, owing to a resonance effect caused by increased internal loss, bandwidth characteristics of the optical amplifier may be improved. Therefore, the optical amplifier of the present invention can have a wide bandwidth even at a low current condition.

Figure 1:
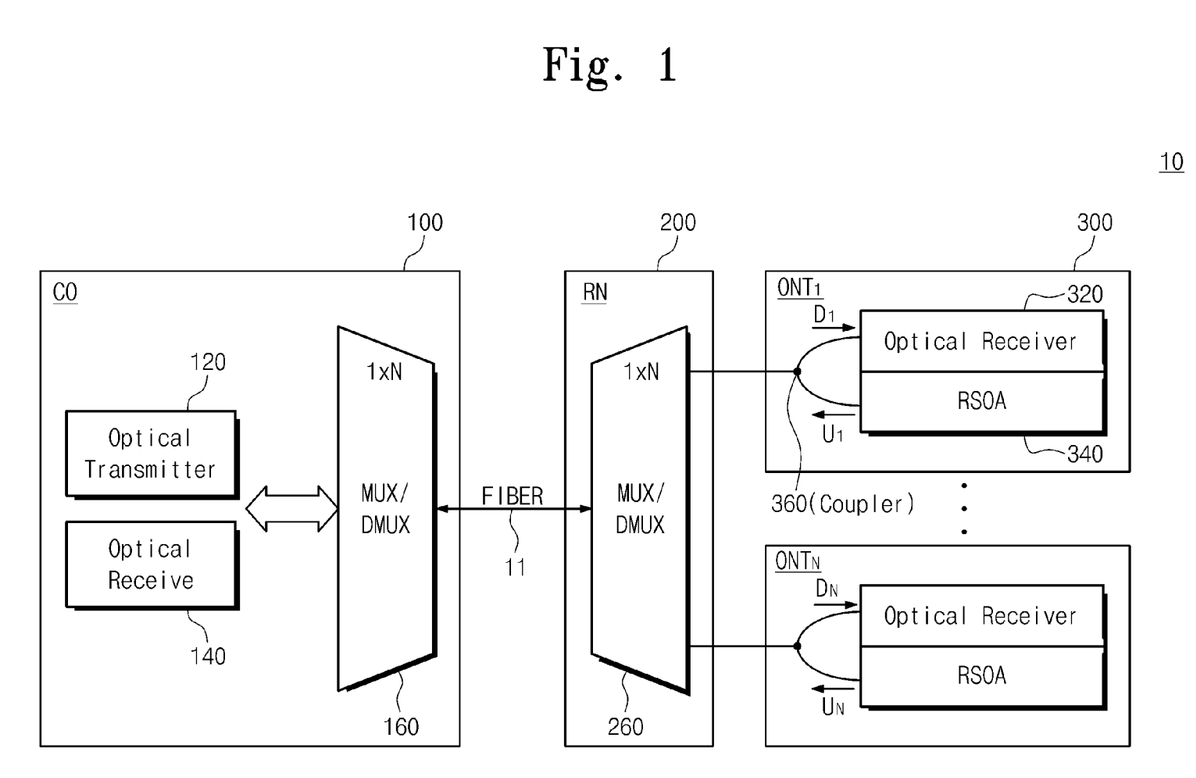
FIG. 1 is a view illustrating a communication system according to an embodiment of the present invention.

FIG. 1 illustrates a communication system 10 according to an embodiment of the present invention. Referring to FIG. 1, the communication system 10 may include a center office (CO) 100, a remote node (RN) 200, and an optical network terminal (ONT) 300. The ONT 300 may include a reflective semiconductor optical amplifier (RSOA) 340 having adjustable internal loss. The ONT 300 may include a plurality of $ONT_1$ to $ONT_N$.

The communication system 10 shown in FIG. 1 is an RSOA based wavelength division multiplexing-passive optical network (WDM-PON) configured to reuse optical signals. In the present invention, however, the communication system 10 is not limited to the RSOA based WDM-PON. The communication system 10 may be a system including an optical amplifier of which internal loss can be adjusted for producing a resonance effect.

The CO 100 may include an optical transmitter 120 constituted by a reflective optical amplifier or an optical source configured to transmit downstream signals, an optical receiver 140 configured to receive upstream signals, and an optical multiplexer/demultiplexer (MUX/DMUX) 160 configured to multiplex/demultiplex optical wavelengths.

The RN 200 may include an optical MUX/DMUX 260 constituted by an arrayed waveguide grating (AWG) or a thin film filter (TFF). The optical MUX/DMUX 260 may divide multiplexed signals according to wavelengths and transmit the divided signals to the $ONT_1$ to $ONT_N$ through optical fibers.

The ONT 300 may include an optical receiver 320, the RSOA 340, and a coupler or circulator 360. The ONT 300 may be provided in the form of a separate device or a device integrated on a substrate. The coupler or circulator 360 divides downstream optical power received through the optical fiber into the optical receiver 320 and the RSOA 340 in consideration of a power budget and gain saturation input power of the RSOA 340.

The optical receiver 320 receives a downstream signal $D_i$ (where i ranges from 1 to N), and the RSOA 340 modulates a received downstream signal into an upstream signal $U_i$ (where i ranges from 1 to N) and transmits the upstream signal $U_i$ to the CO 100.

Optical signals modulated as upstream signals $U_i$ by RSOAs 340 may be transmitted to the optical MUX/DMUX 260 of the RN 200 through the optical fibers and may be multiplexed by the optical MUX/DMUX 260. Then, the multiplexed upstream signals $U_i$ may be transmitted to the CO 100 through an optical fiber 11. In the CO 100, the multiplexed upstream signals U, may be demultiplexed into respective wavelength channels by the optical MUX/DMUX 160 and input to the optical receiver 140. That is, finally, the optical receiver 140 receives the upstream signals $U_i$.

In the current embodiment of the present invention, the communication system 10 includes the RSOA 340 of which the internal loss can be adjusted to produce a resonance effect during an electro-optic modulation. Therefore, at the same current level, the communication system 10 can have a wider bandwidth than a communication system including a typical optical amplifier. As a result, the communication system 10 is advantageous for developing a low power consuming office and an optical network terminal module.

Figure 2:
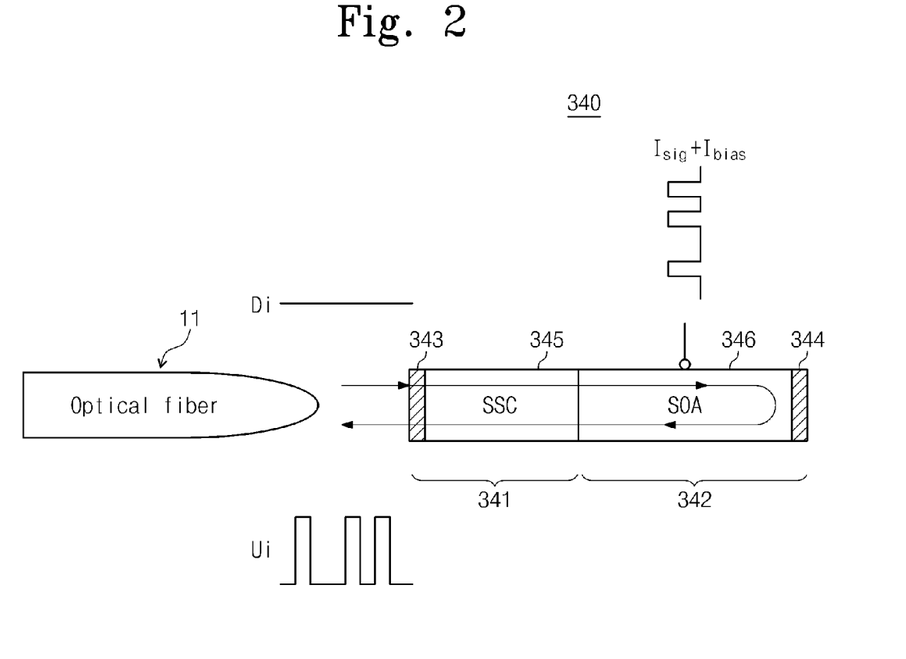
FIG. 2 is a functional view illustrating a reflective semiconductor optical amplifier (RSOA) of FIG. 1 according to a first embodiment of the present invention.

FIG. 2 is a functional view illustrating the RSOA 340 of FIG. 1 according to a first embodiment of the present invention. Referring to FIG. 2, the RSOA 340 includes a passive waveguide region 341 and an active waveguide region 342. The passive waveguide region 341 changes optical mode for improving coupling efficiency when an input downstream signal Di is coupled to the active waveguide region 342, and the active waveguide region 342 amplifies/modulates the downstream signal Di received through the passive waveguide region 341 in response to an injected current. In the current embodiment, the active waveguide region 342 may have increased internal loss. Owing to the increased internal loss of the active waveguide region 342, resonance effect can be induced and the effect can cause increased bandwidth. An explanation will be given later on a method of increasing internal loss.

The passive waveguide region 341 and the active waveguide region 342 may be coupled to each other by a single integration method or a hybrid integration method. Examples of the single integration method include a butt coupling method, an evanescent coupling method, and a selective growing method.

The RSOA 340 may include a anti-reflection film 343, which is deposited on the end of the passive waveguide region 341 and connected to the optical fiber 11 directly or through an optical component such as a lens for reducing reflection of an optical signal. The anti-reflection film 343 may be an exit surface of an upstream signal Ui. That is, the anti-reflection film 343 may be used as an exit end as well as an entrance end.

The RSOA 340 may be connected to the CO 100 through the single optical fiber 11 for cost reduction. For this, a high-reflection film 344 may be deposited on an end of the active waveguide region 342 opposite the anti-reflection film 343 to reflect a received downstream signal Di.

The RSOA 340 may modulate an incident downstream signal Di using a modulation current Isig. In detail, the density of carriers varies according to the modulation current Isig, and thus optical signal modulation is possible.

Referring again to FIG. 2, the passive waveguide region 341 may include a spot size converter (SSC) 345 to increase the optical coupling efficiency between the optical fiber 11 and a semiconductor optical amplifier (SOA) 346. The active waveguide region 342 may include the SOA 346 configured to amplify/modulate an input downstream signal Di. The SSC 345 and the SOA 346 will be described in detail with reference to FIGS. 3 and 4.

Figure 3:
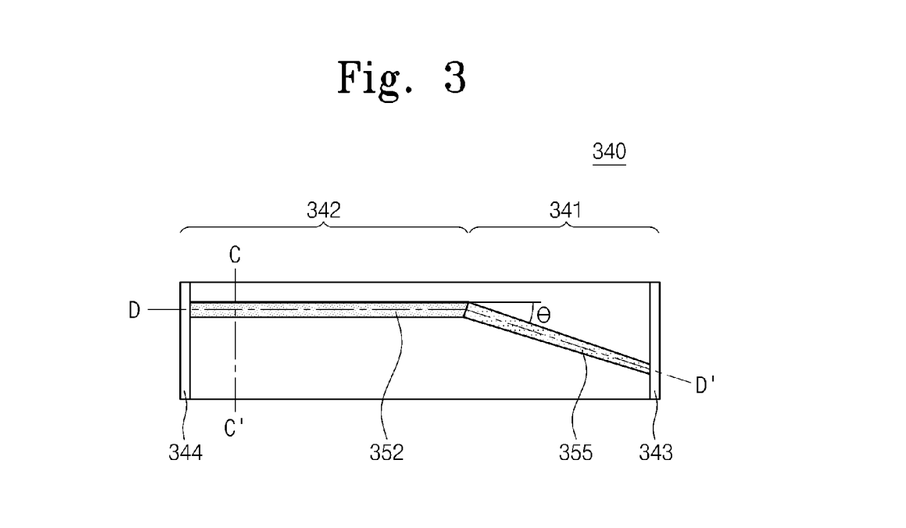
FIG. 3 is a plan view illustrating the RSOA of FIG. 2.

FIG. 3 is a plan view illustrating the RSOA 340 of FIG. 2. Referring to FIG. 3, the RSOA 340 may include an active waveguide 352 and a passive waveguide 355. The active waveguide 352 may be included in the SOA 346 shown in FIG. 2, and the passive waveguide 355 may be included in the SSC 345 shown in FIG. 2.

The passive waveguide 355 of the RSOA 340 may be angled from the exit surface by a predetermined angle of about 5 degrees to about 30 degrees so as to reduce reflectance. The passive waveguide 355 may have a shape similar to the optical mode of an optical fiber for increasing optical coupling efficiency. In addition, an end portion of the passive waveguide 355 may be tapered to change optical mode for increasing optical coupling efficiency.

Figure 4:
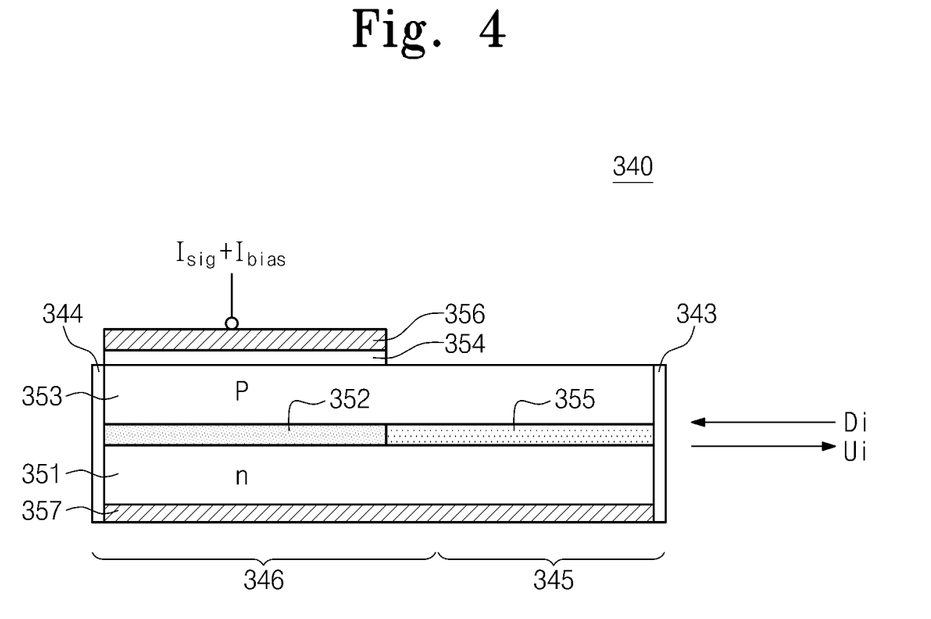
FIG. 4 is a sectional view of the RSOA, taken along line D-D of FIG. 3.

FIG. 4 is a sectional view illustrating the RSOA 340 taken along line D-D' of FIG. 3. Referring to FIG. 4, the RSOA 340 may include an n-type substrate (lower clad layer) 351, the active waveguide 352, a (upper) clad layer 353 disposed on the active waveguide 352, an ohmic layer 354, a p-type electrode 356, and an n-type electrode 357. The ohmic layer 354 reduces the ohmic resistance between the clad layer 353 and the p-type electrode 356. The active waveguide 352 may have a buried hetero structure.

The anti-reflection film 343 may be deposited on a surface of the RSOA 340 onto which an optical signal is incident. The passive waveguide 355 may be butt-joined and include an InGaAsP layer having a band gap of about 1.1 μm to about 1.3 μm.

Figure 5:
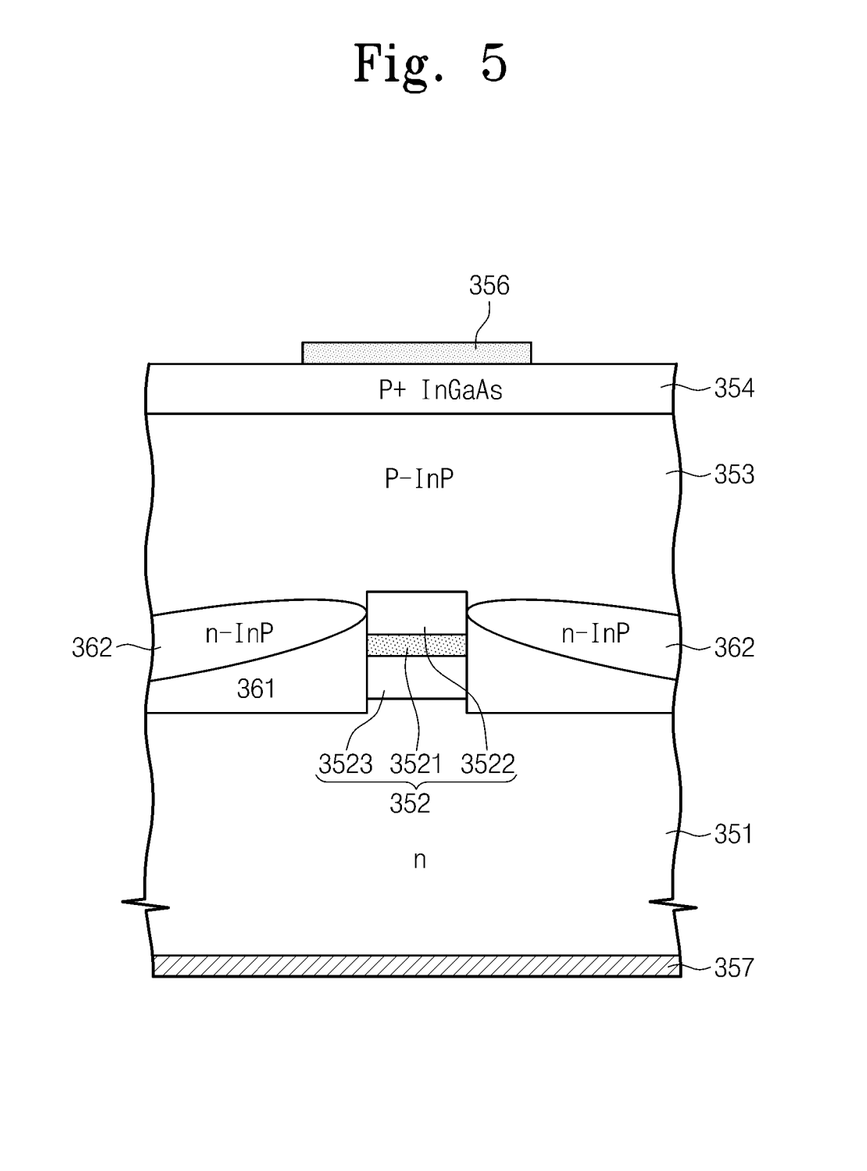
FIG. 5 is a sectional view taken along line C-C' of FIG. 3.

FIG. 5 is a sectional view taken along line C-C' of FIG. 3 to illustrate the SOA 346. Referring to FIG. 5, a buried heterostructure including p-InP/n-InP/p-InP 361/362/353 (current blocking layers) may be formed in the horizontal direction of the active waveguide 352.

The active waveguide 352 may include an i (intrinsic) type InGaAsP bulk or quantum well gain medium 3521 with band gap of 1.55-μm; and upper and lower separate confinement heterostructure (SCH) layers 3522 and 3523 for effectively confining a current. Generally, a quantum well structure has good gain, saturation, and temperature characteristics but large polarization dependence; and a bulk structure has relatively poor gain, saturation, and temperature characteristics as compared with the quantum well structure although the polarization-dependent characteristics of the bulk structure can be improved by properly applying a tensile stress when an active region grows.

The upper clad layer 353 may be a p-InP layer.
The lower clad layer 351 may be an n-InP layer.
The ohmic layer 354 may be a p+-InGaAs layer.
The widths of the active waveguide 352 and the passive waveguide 355 are in the range of about 0.5 μm to about 3 μm. The SSC 345 may be disposed only at a side onto which an optical signal is incident, and the high-reflection film 344 may be deposited on the other side opposite to the signal-incident side. An optical signal may be input and output through the same optical fiber, and thus the optical signal may pass through the gain medium 352 twice.

The modulation speed of an optical signal is basically determined by the density of carriers, that is, the lifetime of the carriers. The lifetime of the carriers can be reduced by increasing the density of the carriers. However, a current of about several hundreds of milliampheres (mA) should be applied to a typical optical amplifier for transmitting signals at a rate of about 2.5 Gbps.

On the contrary, the RSOA 340 of the present invention is configured to increase the internal loss of the active waveguide region 342 so that the bandwidth usually limited due to the lifetime of carriers can be increased by resonance effect. That is, the internal loss of the RSOA 340 can be increased to produce a resonance effect. Therefore, although a low current is applied to the RSOA 340, the RSOA 340 can have a relatively wide bandwidth as compared with a typical optical amplifier.

In an embodiment, internal loss can be increased by controlling internal loss factors individually. Examples of the internal loss factors include absorption coefficient and scattering loss.

Absorption coefficient can be increased by controlling doping of a gain medium, an SCH layer, or a clad layer to adjust effects such as free carrier absorption or intervalence band absorption. In the current embodiment of the present invention, doping of the gain medium 3521, the SCH layers 3522 and 3523, and the clad layers 351 and 353 may be controlled to adjust the absorption of the gain medium 352 and interfaces.

Scattering loss can be controlled by adjusting structures of a waveguide such as surface roughness or width when the waveguide is fabricated. In the current embodiment of the present invention, scattering loss may be increased to a desired level by adjusting the interfacial roughness between the SCH layer 3522 and the clad layer 353, the SCH layer 3523 and the clad layer 351, or the gain medium 3521 and the SCH layers 3522 and 3523.

The bandwidth of the RSOA 340 can be widened by resonance effect caused by increasing the internal loss of the RSOA 340 as described above.

Figure 6:
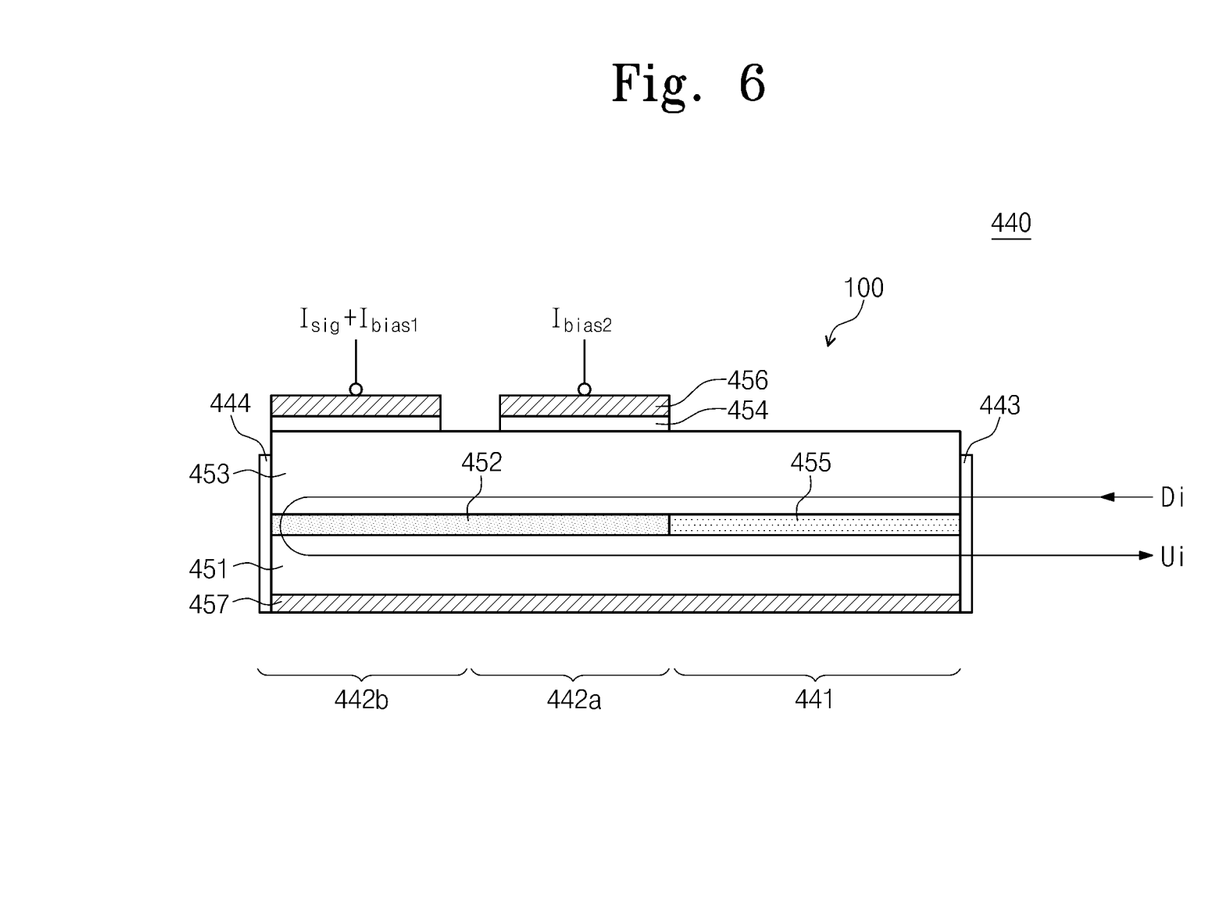
FIG. 6 is a sectional view illustrating a multifunctional optical amplifier according to an embodiment of the present invention.

FIG. 6 is a sectional view illustrating a multifunctional optical amplifier 440 according to an embodiment of the present invention. Referring to FIG. 6, the multifunctional optical amplifier 440 is configured by integrating an SOA 442b with an RSOA 442a having the same structure as the RSOA 340 of FIG. 4. Referring to FIG. 6, like the modulation current Isig and the bias current Ibias shown in FIG. 4, a modulation current Isig, a bias current Ibias1, and a bias current Ibias2 are injected to the RSOA 442b and the SOA 442a. The arranged order of the RSOA 442a and the SOA 442b, and combinations of the currents applied to the RSOA 442a and the SOA 442b may be reversed.

One of the additional SOAs 442a and 442b shown in FIG. 6 may be a laser diode. A current may be independently injected to the SOA 442b for radio frequency (RF) modulation and biasing.

Through computer simulation, the wider bandwidth of multifunctional optical amplifier 440 can be simulated, which is caused by combined mechanism between device sections. For the same purpose, devices with a distributed feedback (DFB) structure or a distributed Bragg reflector (DBR) structure may be integrated. In these ways, the bandwidth of the multifunctional optical amplifier 440 can be increased.

Figure 7A:
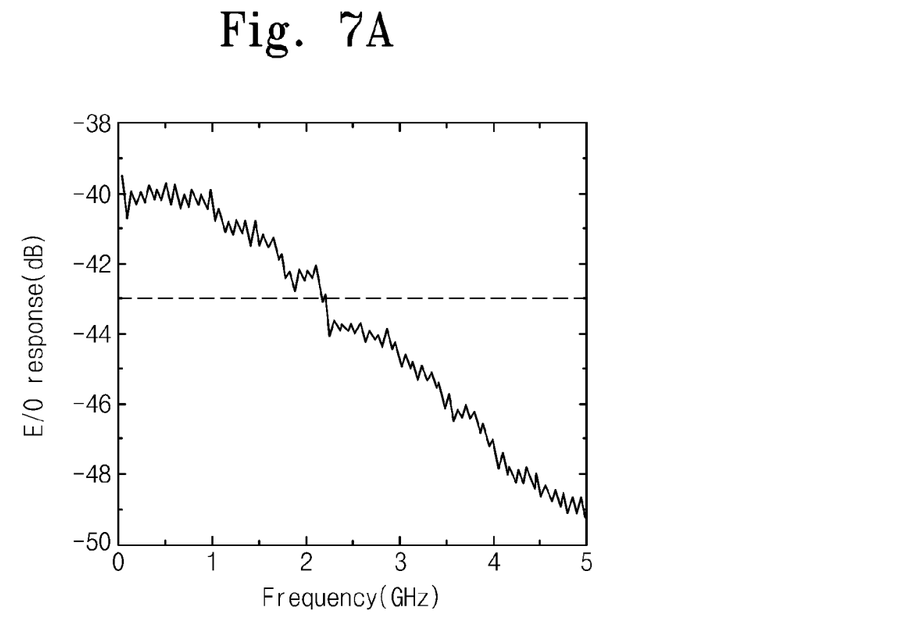
FIGS. 7A and 7B are graphs for comparing bandwidth characteristics of a typical optical amplifier and an RSOA of the present invention.
Figure 7B:
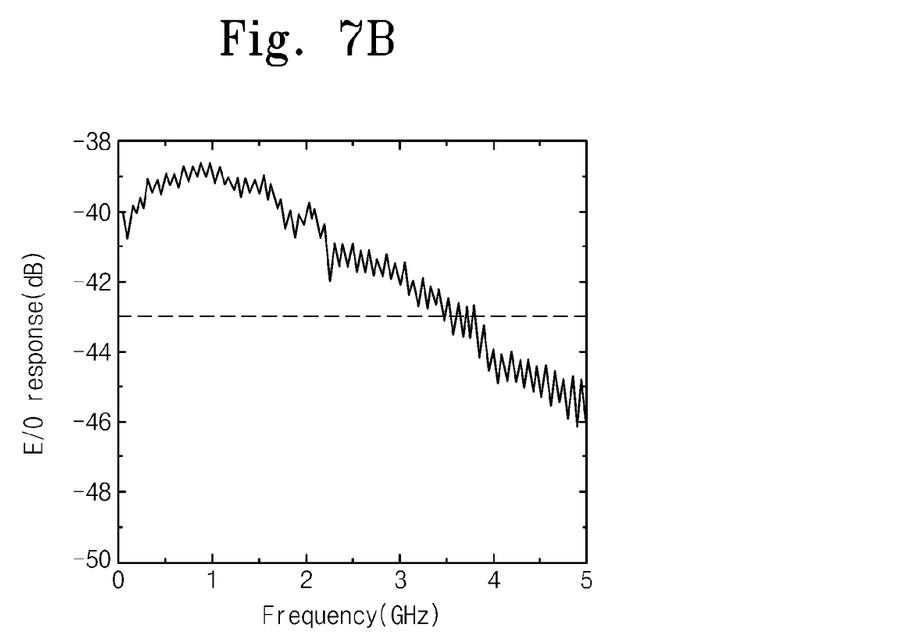

FIGS. 7A and 7B are graphs for comparing bandwidth characteristics of a typical optical amplifier and an RSOA of the present invention. As shown in FIG. 7B, in the present invention, the electro-optic response (E/O response) of the RSOA, which represents the efficiency of optical modulation carried out by current modulation with respect to frequency, is increased at about 1 GHz relative to DC level owing to a resonance effect and is then decreased. That is, it can be understood that the RSOA of the present invention has a wider bandwidth than a typical optical amplifier. As explained above, the bandwidth characteristics of a device are largely affected by resonance effect.

According to generally known E/O response measurement results, an optical amplifier operates like a low pass filter (LP) as shown in FIG. 7A. But, when a modulated signal is input to a active medium, the waveguide operates like a high pass filter (HPF) so that a signal slower than the carrier lifetime is absorbed by the waveguide. The combined effect of these two mechanisms causes resonance under influence of predetermined internal loss.

Generally, a typical optical amplifier functions as a low pass filter, thereby resulting in those shown in FIG. 7A. In the present invention, however, the internal loss of the RSOA is adjusted so that the characteristic curve of FIG. 7B can be obtained. In the same current condition (80 mA), the RSOA of the present invention has a wider bandwidth than the typical optical amplifier.

In the present invention, bandwidth characteristics are improved by resonance effect caused by increasing internal loss. However, in this case, since static characteristics such as optical power can be decreased, internal loss should be increased within the proper range so as not to largely degrade static characteristics.

Referring again to FIGS. 7A and 7B, bandwidths with different doping densities in p-type and n-type clad layers 353 and 351 were measured. FIG. 7A shows a measured bandwidth of an optical amplifier prepared by doping a p-type clad layer 353 to a density of about $3 \times 10^{23}$ m$^{-3}$ and an n-type clad layer 351 to a density of about $5 \times 10^{23}$ m$^{-3}$, and FIG. 7B shows a measured bandwidth of an optical amplifier prepared by doping a p-type clad layer 353 to a density of about $5 \times 10^{23}$ m$^{-3}$ and an n-type clad layer 351 to a density of about $1 \times 10^{24}$ m$^{-3}$.

The relationship between the internal loss and free carrier absorption of the doped samples can be expressed by Equation 1 below.

$$\alpha_i = \alpha_n + \alpha_p + \alpha_s \quad \text{[Equation 1]}$$

In Equation 1, $\alpha_i$, $\alpha_n$, $\alpha_p$, and $\alpha_s$ denote total internal loss, absorption by free electrons, absorption by free holes, and scattering loss, respectively. According to Equation 1, the internal loss of the p-type clad layer 353 is increased by about 4 cm$^{-1}$, and the internal loss of the n-type clad layer 351 is increased by about 1.5 cm$^{-1}$. In addition, the effects of scattering loss slightly varying according to processes may further increase the internal loss.

The internal loss of the typical optical amplifier having a bandwidth as shown in FIG. 7A was measured at about 15 cm$^{-1}$. On the other hand, the internal loss of the optical amplifier of the current embodiment having a bandwidth as shown in FIG. 7B was measured at about 30 cm$^{-1}$. The quantum efficiencies of the two optical amplifiers had similar values of about 50%. Therefore, it can be understood that bandwidth can be increased by increasing internal loss.

Figure 8:
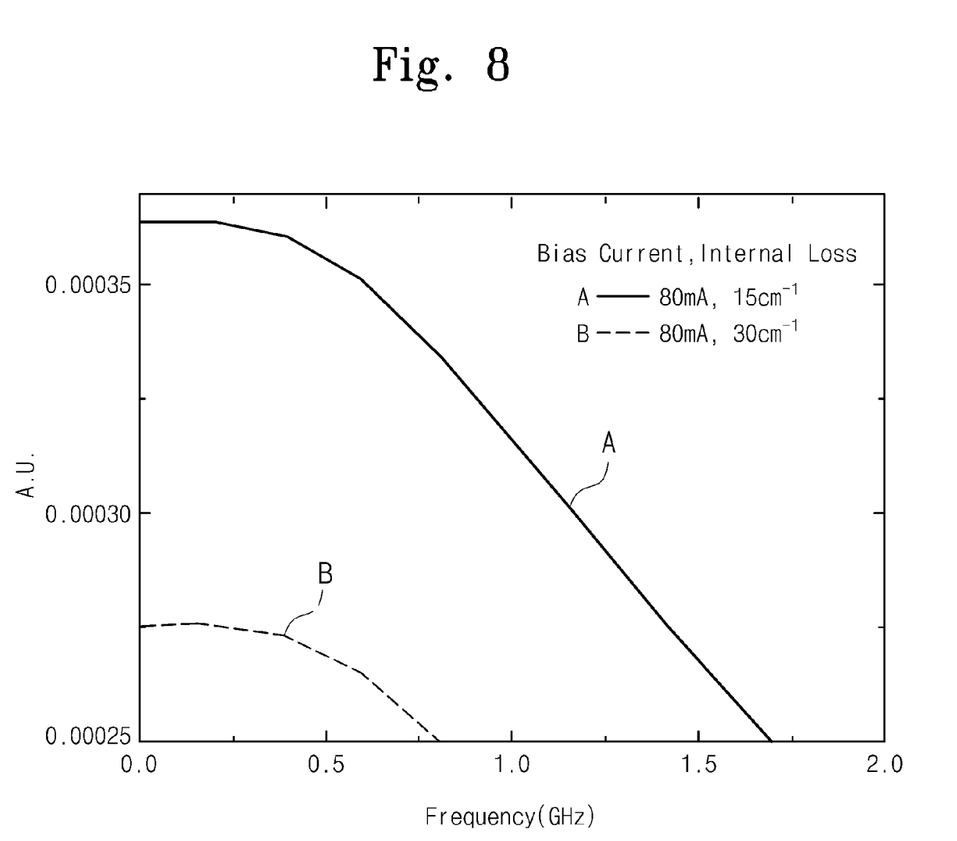
FIG. 8 is a graph showing resonance effect simulation results for different internal loss conditions in the same bias current condition.

FIG. 8 is a simulation graph showing resonance effect for different internal losses at the same bias current. Referring to FIG. 8, in the case of a typical optical amplifier (A) having an internal loss of about 15 cm$^{-1}$, electro-optic response [A.U. (arbitrary unit)] is steeply decreased in proportion to frequency. In the case of an optical amplifier (B) of the present invention having an internal loss of about 30 cm$^{-1}$, electro-optic response [A.U.] is initially increased relative to a DC level due to a slight resonance effect and is then decreased. Therefore, according to the present invention, the optical amplifier (A) having an internal loss of about 30 cm$^{-1}$ may have a wider bandwidth than the typical optical amplifier (B) having an internal loss about 15 cm$^{-1}$.

As described above, according to the present invention, internal loss can be controlled by varying the doping density of a clad layer, so as to produce or a resonance effect for improving bandwidth characteristics.

An RSOA is explained with reference to FIGS. 1 through 8. However, the present invention is not limited to the RSOA. The present invention may be applied to any kind of optical amplifier including a semiconductor optical amplifier of which internal loss can be adjusted to produce a resonance effect.

Figure 9:
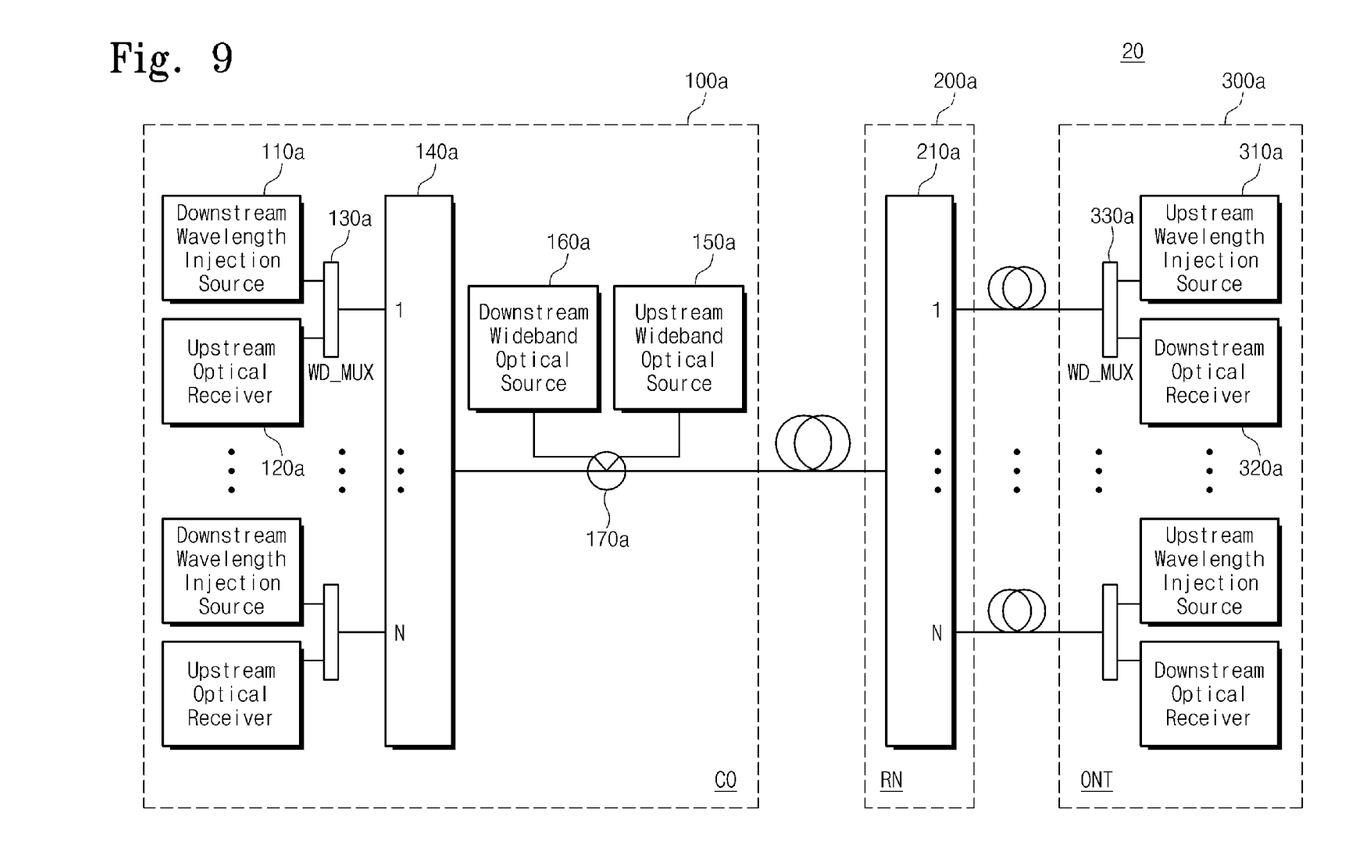
FIG. 9 is a view illustrating another communication system including an optical amplifier according to another embodiment of the present invention.

FIG. 9 is a view illustrating a communication system 20 including an optical amplifier according to another embodiment of the present invention. Referring to FIG. 9, the communication system 20 is a WDM-PON using a wavelength injection source. In the communication system 20, a CO 100a and an RN 200a are connected through a single mode fiber (SMF), and the RN 200a is connected to a plurality of ONTs 300a through a plurality of SMFs. The SMFs have only a single propagation mode for transmitting wavelengths and are widely used as main transmission media in recent optical communication systems.

In the current embodiment, downstream and upstream wavelength injection sources, 110a and 310a may include SOAs each capable of generating resonance effect by adjusting its internal loss.

Each of the SMFs has a core/clad/coating structure. The SMFs have a wide bandwidth as compared with a multimode fiber because intermodal dispersion does not occur in the SMFs, and the SMFs have good loss and dispersion characteristics. Therefore, the SMFs can be used for wideband long-haul transmission.

The CO 100a includes two wideband optical sources (upstream and downstream wideband optical sources 150a and 160a) configured to output optical signals having different wavelength bandwidths; a 2*2 optical splitter 170a; downstream wavelength injection sources 110a, upstream optical receivers 120a; wavelength division multiplexers (WD_MUXs) 130a configured to multiplex/demultiplex upstream/downstream signals having different wavelengths; and a 1*N waveguide grating 140a configured to demultiplex multiplexed upstream signals and multiplex downstream signals.

The RN 200a may include a 1*N waveguide grating 210a configured to demultiplex multiplexed downstream signals and multiplex upstream signals.

Each of the ONTs 300a (subscriber terminals) may include a downstream optical receiver 320a, an upstream wavelength injection source 310a, and a WD_MUX 330a configured to multiplex/demultiplex upstream/downstream optical signals having different wavelengths.

In downstream transmission, the WDM-PON operates as follows.

The downstream wideband optical source 160a of the CO 100a may output a downstream wideband light beam to the 1*N waveguide grating 140a through the 2*2 optical splitter 170a, and the 1*N waveguide grating 140a may split the downstream wideband light beam according to the spectrum of the light beam. The light beams which are spectrum-split by the 1*N waveguide grating 140a may be injected to the downstream wavelength injection sources 110a through the WD_MUXs 130a, respectively.

Then, the downstream wavelength injection sources 110a may output optical downstream signals, which have the same wavelengths as those of channels injected by the WD_MUXs 130a and are directly modulated according to transmission data, and the downstream signals output from the downstream wavelength injection sources 110a may be re-input to the 1*N waveguide grating 140a through the WD_MUXs 130a so as to be multiplexed. Herein, the downstream signal is directly modulated by amplifying the wavelengths of the transmission signals using wavelength-split wideband light beams received through the WD_MUXs 130a. The multiplexed downstream signals may be transmitted to the RN 200a through the 2*2 optical splitter 170a and the SMF.

In the RN 200a, the multiplexed downstream signals may be demultiplexed by the 1*N waveguide grating 210a. The demodulated downstream signals may be transmitted to the ONTs 300a through the SMFs. In the ONTs 300a, the downstream signals may be transmitted to the downstream optical receivers 320a through the WD_MUXs 330a and may be detected as electrical signals.

On the other hand, upstream transmission of the WDM-PON is as follows.

The upstream wideband optical source 150a of the CO 100a may output an upstream wideband light beam to the 1*N waveguide grating 210a of the RN 200a through the 2*2 optical splitter 170a and the SMF. The wide light beam may be spectrum-divided by the 1*N waveguide grating 210a into channels, and the resulting channel light beams may be transmitted to the ONTs 300a through the SMFs. In the ONTs 300a, the channel light beams may be injected to the upstream wavelength injection sources 310a through the WD_MUXs 330a.

Then, the upstream wavelength injection sources 310a may output upstream signals, which have the same wavelengths as those of the channel signals and are directly modulated according to upstream data to be transmitted. The upstream signals output from the upstream wavelength injection sources 310a may be transmitted to the RN 200a through the WD_MUXs 330a and be multiplexed by the 1*N waveguide grating 210a of the RN 200a.

The multiplexed upstream signals may be transmitted to the CO 100a through the SMF. In the CO 100a, the multiplexed upstream signals may be input to the 1*N waveguide grating 140a through the 2*2 optical splitter 170a and may be demultiplexed. The demultiplexed upstream signals may be input to the upstream optical receivers 120a through the WD_MUXs 130a and may be detected as electrical signals.

At this time, the 1*N waveguide grating 140a of the CO 100a may demultiplex multiplexed upstream signals which are input through a single terminal. Then, while the 1*N waveguide grating 140a outputs the demultiplexed upstream signals through N terminals, the 1*N waveguide grating 140a may multiplex downstream signals input through the N terminals and output the multiplexed downstream signals through the single terminal.

Similarly, while the 1*N waveguide grating 210a of the RN 200a demultiplexes multiplexed downstream signals input through a single terminal and outputs the demultiplexed downstream signals through N terminals, the 1*N waveguide grating 210a may multiplex upstream signals input through the N terminals and output the multiplexed upstream signals through the single terminal. These operations are possible because the band pass characteristics of a waveguide grating are periodic according to the free spectral range of the waveguide grating. In this case, a network can be simply operated and maintained because wavelength alignment is not necessary between an optical source and a MUX/DMUX.

The optical amplifier of the present invention can be used for an upstream wavelength injection source and a downstream wavelength injection source.

The active waveguide of the present invention may be configured to produce a resonance effect by increasing its internal loss. Resonance effect occurs when internal loss in device is combined with predetermined length of device and current level. That is, a resonance effect occurs in the optical amplifier when a low pass filter operation determined by the carrier lifetime is combined at a certain condition with a high pass filter operation for transmitting a signal.

As explained above, the optical amplifier of the present invention may be provided in a single-SOA structure. However, the optical amplifier of the present invention is not limited to the single SOA structure. For example, the optical amplifier of the present invention may have a structure in which an SOA is added to a single SOA structure. In the two-SOA structure, a resonance effect may be obviously observed owing to interaction between the two SOA.

The SOA 346 shown in FIG. 2 has a single SOA structure. However, the SOA of the present invention may have a multiple SOA structure. For example, the SOA of the present invention may have a two SOA structure.

Figure 10:
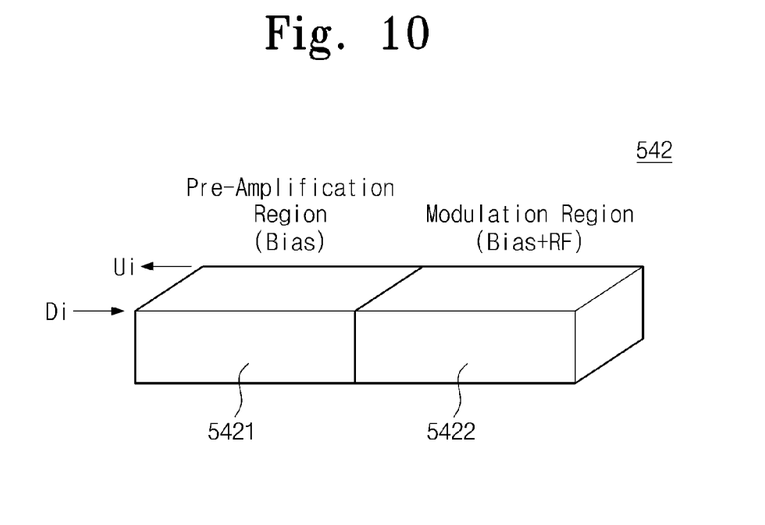
FIG. 10 is a view illustrating an active waveguide region having a two semiconductor optical amplifier (SOA) structure according to a second embodiment of the present invention.

FIG. 10 is a view illustrating an active waveguide region 542 having a two SOA structure according to a second embodiment of the present invention. Referring to FIG. 10, the active waveguide region 542 may include a pre-amplification region 5421 and a modulation region 5422.

The pre-amplification region 5421 may amplify an optical signal in response to a bias current applied to the pre-amplification region 5421. The pre-amplification region 5421 may include a gain medium.

The modulation region 5422 may modulate and amply an optical signal amplified by the pre-amplification region 5421 in response to a bias current and a radio frequency (RF) signal applied to the modulation region 5422. The modulation region 5422 may have the same structure and function as that of the active waveguide region 342 shown in FIG. 2.

Figure 11:
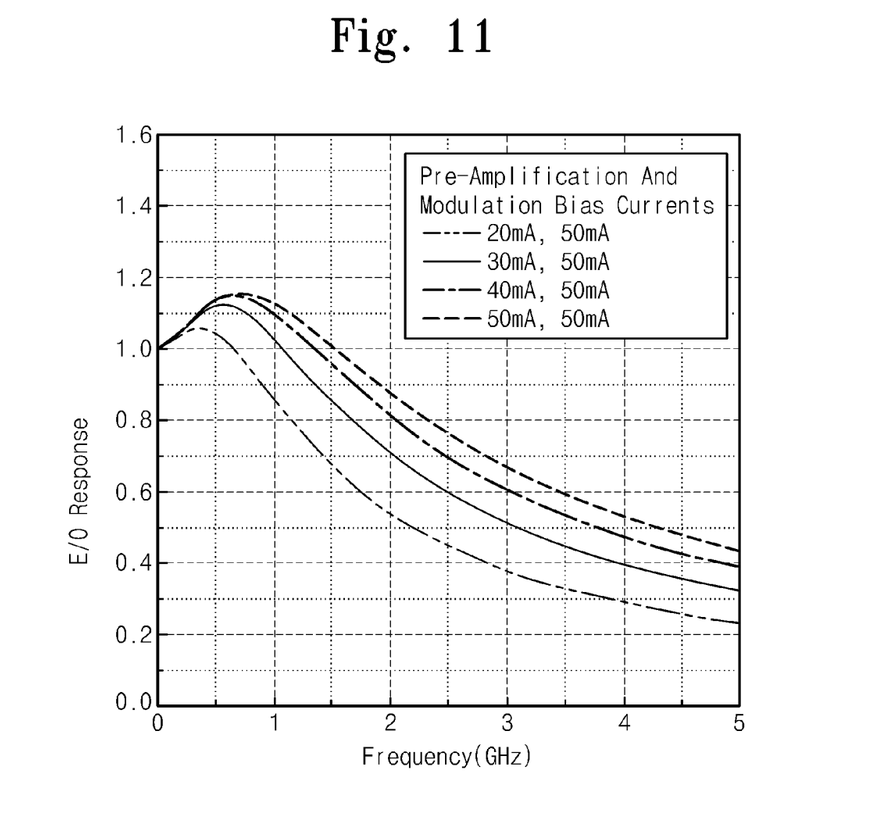
FIG. 11 is a graph showing computer simulation results of an optical amplifier having the active waveguide region of FIG. 10 for the case where the optical amplifier has a length of 0.3 mm/0.3 mm.

FIG. 11 is a graph showing computer simulation results of an optical amplifier having the active waveguide region 542 of FIG. 10. In FIG. 11, the length of the optical amplifier is 0.3 mm/0.3 mm. That is, the length of the pre-amplification region 5421 is 0.3 mm, and the length of the modulation region 5422 is 0.3 mm. Referring to FIG. 11, resonance effect is observed in all current conditions. Particularly, in a (50 mA, 50 mA) bias condition, a bandwidth equal to or larger than 4 GHz is obtained.

Figure 12:
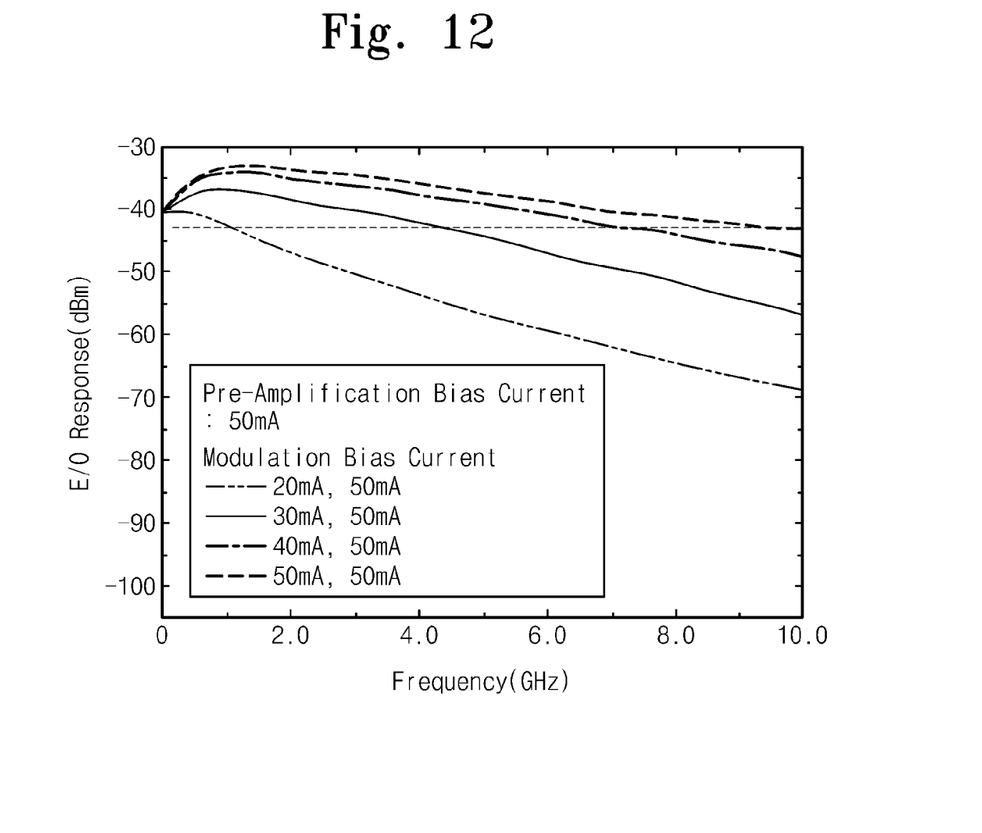
FIG. 12 is a graph obtained by measuring an optical amplifier having the active waveguide region of FIG. 10 for the case where the optical amplifier has a length of 0.1 mm/0.5 mm.

FIG. 12 is a graph obtained by measuring characteristics of an optical amplifier having an active waveguide region such as that shown in FIG. 10. In FIG. 12, the length of the optical amplifier is 0.1 mm/0.5 mm. That is, the length of the pre-amplification region 5421 is 0.1 mm, and the length of the modulation region 5422 is 0.5 mm. Referring to FIG. 12, the optical amplifier has a wider bandwidth in all current conditions as compared with that of a single SOA structure.

Figure 13:
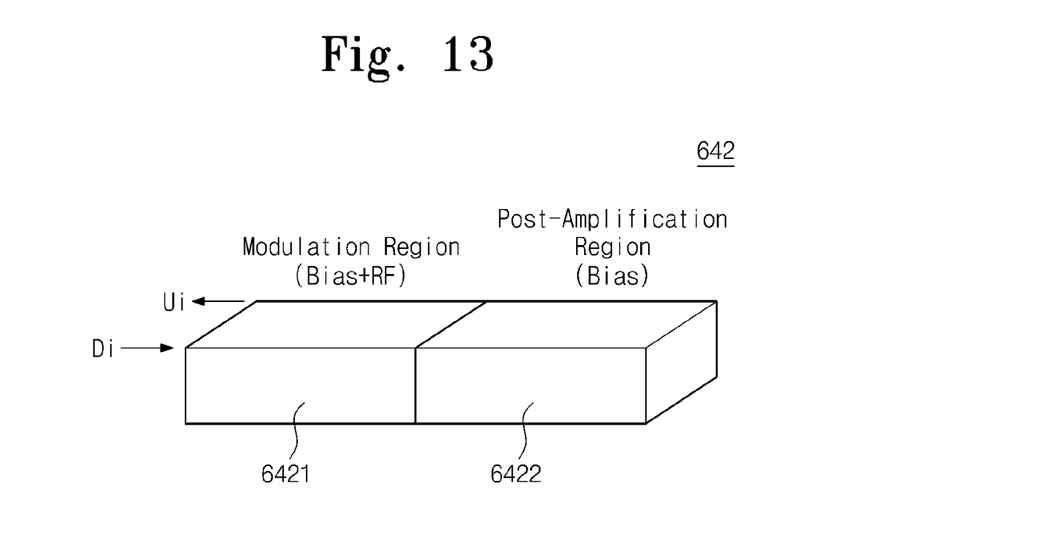
FIG. 13 is a view illustrating an active waveguide region having a two SOA structure according to a third embodiment of the present invention.

FIG. 13 is a view illustrating an active waveguide region 642 having a two SOA structure according to a third embodiment of the present invention. Referring to FIG. 13, the active waveguide region 642 may include a modulation region 6421 and a post-amplification region 6422. The modulation region 6421 may modulate and amply an optical signal in response to a bias current and an RF signal applied to the modulation region 6421. The post-amplification region 6422 may amplify an optical signal modulated and amplified by the modulation region 6421 in response to a bias current applied to the post-amplification region 6422.

As described above, the optical amplifier of the present invention can have a wide bandwidth by producing a resonance effect through internal loss adjustment. Therefore, the optical amplifier of the present invention can have a desirable bandwidth in a low current condition.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An optical amplifier comprising:
a passive waveguide region configured to receive an incident optical signal and to adjust a mode of the optical signal; and
an active waveguide region integrated with the passive waveguide region and receiving the adjusted optical signal from the passive waveguide region, the active waveguide region being configured to perform gain modulation on the received optical signal by changing a density of the carriers therein in response to a first current applied to the active waveguide region, wherein an intensity of the optical signal is adjusted by changing the density of the carriers,
wherein an internal loss of the active waveguide region is adjusted to produce a resonance-like form so that in response to an increasing frequency of the optical signal, an electro-optic response of the optical amplifier has a net increase at first, and then begins to have a net decrease at a predetermined value to thereby increase a bandwidth of the active waveguide,
wherein the internal loss of the active waveguide region is increased by increasing an absorption coefficient thereof by controlling a doping of the active waveguide region.

2. The optical amplifier of claim 1, wherein the internal loss of the active waveguide region is increased by increasing scattering loss of the active waveguide region.

3. The optical amplifier of claim 2, wherein the scattering loss of the active waveguide region is increased by adjusting a surface roughness or width of the active waveguide region.

4. The optical amplifier of claim 1, further comprising a laser diode disposed in the active waveguide region and configured to receive a second current that is independent of the first current, the second current for radio frequency (RF) modulation or biasing.

5. An optical amplifier comprising:
a passive waveguide region configured to receive an incident optical signal and to adjust a mode of the optical signal; and
an active waveguide region integrated with the passive waveguide region and receiving the adjusted optical signal from the passive waveguide region, the active waveguide region being configured to perform gain modulation on the received optical signal by changing a density of the carriers therein in response to a first bias current applied thereto, wherein an intensity of the optical signal is adjusted by changing the density of the carriers, wherein the active waveguide region includes
a modulation region configured to modulate the received optical signal in response to the first bias current and an RF signal applied to the modulation region, and
an amplification region configured to amplify the modulated optical signal in response to a second bias current applied to the amplification region,
wherein the active waveguide region has an increased bandwidth because of a resonance-like form so that in response to an increasing frequency of the optical signal, an electro-optic response of the optical amplifier has a net increase at first, and then begins to have a net decrease at a predetermined value caused by internal loss of the active waveguide region,
wherein the internal loss of the active waveguide region is increased by increasing an absorption coefficient thereof by controlling a doping of the active waveguide region.

6. An optical amplifier comprising:
a passive waveguide region configured to receive an incident optical signal and to adjust a mode of the optical signal; and
an active waveguide region integrated with the passive waveguide region and receiving the adjusted optical signal from the passive waveguide region, the active waveguide region being configured to perform gain modulation on the received optical signal by changing a density of the carriers therein in response to a first bias current applied thereto, wherein an intensity of the optical signal is adjusted by changing the density of the carriers, wherein the active waveguide region includes
an amplification region configured to amplify the received optical signal in response to a second bias current applied to the amplification region, and
a modulation region configured to modulate the amplified optical signal in response to the first bias current and an RF signal applied to the modulation region,
wherein the active waveguide region has an increased bandwidth because of a resonance-like form so that in response to an increasing frequency of the optical signal, an electro-optic response of the optical amplifier has a net increase at first, and then begins to have a net decrease at a predetermined value caused by internal loss of the active waveguide region,
wherein the internal loss of the active waveguide region is increased by increasing an absorption coefficient thereof by controlling a doping of the active waveguide region.

7. The optical amplifier of claim 1, wherein the electro-optic response of the optical amplifier has a net increase as the frequency of the optical signal increases from 0 GHz-0.5 GHz, and begins to have a net decrease after the frequency of the optical signal increases above 0.5 GHz.

8. The optical amplifier of claim 1, wherein during a first frequency range of the optical signal, the electro-optic response has a net increase and during a second frequency range of the optical signal greater than the first frequency range, the electro-optic response has a net decrease.

9. The optical amplifier of claim 5, wherein the electro-optic response of the optical amplifier has a net increase as the frequency of the optical signal increases from 0 GHz-0.5 GHz, and begins to have a net decrease after the frequency of the optical signal increases above 0.5 GHz.

10. The optical amplifier of claim 5, wherein during a first frequency range of the optical signal, the electro-optic response has a net increase and during a second frequency range of the optical signal greater than the first frequency range, the electro-optic response has a net decrease.

11. The optical amplifier of claim 6, wherein the electro-optic response of the optical amplifier has a net increase as the frequency of the optical signal increases from 0 GHz-0.5 GHz, and begins to have a net decrease after the frequency of the optical signal increases above 0.5 GHz.

12. The optical amplifier of claim 6, wherein during a first frequency range of the optical signal, the electro-optic response has a net increase and during a second frequency range of the optical signal greater than the first frequency range, the electro-optic response has a net decrease.

* * * * *